United States Patent [19]

Cline et al.

[11] Patent Number: 5,204,625

[45] Date of Patent: Apr. 20, 1993

[54] SEGMENTATION OF STATIONARY AND VASCULAR SURFACES IN MAGNETIC RESONANCE IMAGING

[75] Inventors: Harvey E. Cline, Schenectady, N.Y.; Steven P. Souza, Williamstown, Mass.; William E. Lorensen, Johnsonville, N.Y.; Thomas E. Kennedy, Whitefish Bay, Wis.

[73] Assignee: General Electric Company, Schenectady, N.Y.

[21] Appl. No.: 631,121

[22] Filed: Dec. 20, 1990

[51] Int. Cl.$^5$ .................................. G01R 33/20
[52] U.S. Cl. ................................. 324/306; 324/309
[58] Field of Search ............... 324/306, 309, 300, 307; 128/653.3

[56] References Cited

U.S. PATENT DOCUMENTS

| Re. 33,259 | 7/1990 | Crooks et al. | 324/309 |
|---|---|---|---|
| 4,516,582 | 5/1985 | Redington | 324/309 |
| 4,528,985 | 7/1985 | Macovski | 324/309 |
| 4,591,789 | 5/1986 | Glover et al. | 324/309 |
| 4,609,872 | 9/1986 | O'Donnell | 324/309 |
| 4,734,646 | 3/1988 | Shenoy et al. | 324/309 |
| 4,751,643 | 6/1988 | Lorensen et al. | 364/414 |
| 4,774,957 | 10/1988 | Nambu et al. | 324/309 |
| 4,777,957 | 10/1988 | Wehrli et al. | 324/309 |
| 4,821,213 | 4/1989 | Cline et al. | 364/522 |
| 4,837,512 | 6/1989 | Suzuki | 324/306 |
| 4,876,509 | 10/1989 | Perlmatter | 324/309 |
| 4,918,386 | 4/1990 | Dumoulin et al. | 324/309 |

FOREIGN PATENT DOCUMENTS 0301629  7/1987  European Pat. Off. ............ 324/309

OTHER PUBLICATIONS

*MR Angiography with Two-Dimensional Acquisition and Three-Dimensional Display*, Paul J. Keller et al., Radiology 1989; 173:572-532.

*Three-Dimensional Phase Contrast Angiography*, C. L. Dumoulin et al, Magnetic Resonance in Medicine, 9, 139-149 (1989).

*Two Algorithms for the Three-Dimensional Reconstruction of Tomograms*, H. E. Cline et al., Med. Phys. 15(3), May/Jun. 1988, 320-327.

"Magnetic Resonance in Medicine", vol. 11, 1989, pp. 35-46.

"Radiology", vo. 153, Oct. 1984, pp. 177-180.

"Magnetic Resonance Imaging", vol. 5, 1987, pp. 345-352.

Primary Examiner—Michael J. Tokar
Assistant Examiner—Raymond Y. Mah
Attorney, Agent, or Firm—Lawrence P. Zale; Marvin Snyder

[57] ABSTRACT

A three dimensional image of a human brain or other body structure is constructed using a single flow sensitive data array and a flow insensitive data array to generate the contrasts necessary to differentiate among stationary tissues and also between stationary tissues and flowing blood. A plurality of data points from this combined image data are identified to tissue types and used to segregate the remaining data by using a nearest neighbor process in which each data value takes the tissue type of its nearest neighbor data point.

8 Claims, 7 Drawing Sheets

SEGMENTATION OF STATIONARY AND VASCULAR SURFACES IN MAGNETIC RESONANCE IMAGING

TECHNICAL FIELD

This invention relates to systems and methods for detecting and displaying surfaces of stationary tissue and flowing blood using magnetic resonance imaging data, and, more particularly, to systems for distinguishing among surfaces associated with different stationary tissue types.

BACKGROUND OF THE INVENTION

A surgeon performing an invasive procedure on the human brain requires a method of determining a trajectory through the brain that avoids large blood vessels and critical function areas. Such a trajectory could be determined from a three-dimensional representation of the brain that clearly distinguished among stationary tissue types and between stationary tissue and vascular surfaces. This three dimensional representation could be used, for example, with stereotaxic procedures performed through the intact skull or interstitial laser surgery in which the needle or optical fiber, once inserted, is hidden deep with in the tissue and cannot be visualized.

Procedures associated with the knee, spine, and other internal body structures might also benefit from such a "segmented" three dimensional representation.

The location of blood vessels within an internal body structure may be identified in x-ray procedures such as radiographic angiography and computed tomography by injection of a contrast agent into these vessels. However, x-rays generally differentiate poorly between soft tissue types and thus would be unsuitable for distinguishing between stationary tissues associated, for example, with functional areas of the brain. Also, some patients have an adverse reaction to the contrast agent needed to image blood with x-ray techniques. A preferable technique, therefore, is to employ magnetic resonance imaging (MRI) both to generate a three dimensional representation of the vascular surfaces and of the surfaces of the various stationary tissue types.

A. Acquisition of MRI data

As is understood in the art, three-dimensional arrays of data representing one or more physical properties of a body at regular grid positions may be obtained through the use of MRI.

In an MRI system, the body to be imaged is placed in a strong polarizing magnetic field. Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the gyromagnetic constant $\gamma$ of the nucleus). Nuclei which exhibit this phenomena are referred to herein as "spins".

When a substance such as human tissue is subjected to a uniform magnetic field (polarizing field $B_O$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (RF excitation pulse) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The degree to which the net magnetic moment $M_z$ is tipped, and hence the magnitude of the net transverse magnetic moment $M_t$ depends primarily on the length of time and the magnitude of the applied excitation pulse.

The practical value of this phenomenon resides in the signal which is emitted by the excited spins after the excitation pulse is terminated. The characteristics of this resonance signal, for example, the decay constants of the signal $T_1$ and $T_2$ representing the loss in the spins of longitudinal magnetization and phase coherence, respectively, are related to the physical properties of the tissue containing the excited spins and may be measured to reveal information about the tissue type.

Construction of an image from the resonance signal requires that the components of the resonance signal from spatially separated spins be distinguished and located. Typically this is done by applying a sequence of orthogonal magnetic gradients to the spins prior to and while recording the resonance signal. These gradients cause the spins at various locations to precess at different resonant frequencies depending on their position along the gradient axis. Thus, the position and signal component of spins at each location may be isolated and identified.

An image intensity value is associated with the characteristics of each isolated component signal, and together with the identified position, used to construct an image according to well known reconstruction techniques. Each intensity value and position define a picture element (pixel) of the resultant image.

The prior art is replete with excitation and gradient sequences that are designed to take advantage of particular magnetic resonance phenomena to advantageously differentiate tissue types. Each such pulse sequence and the acquisition of a resulting resonance signal is termed a "measurement cycle".

One such sequence is the well known "spin echo" sequence (SE). In the spin echo sequence, a "180° RF" pulse is applied some time after the RF excitation pulse to flip the magnetization of the sample of precessing nuclei approximately 180°. To the extent that the individual nuclei have dephased after the RF excitation pulse because of magnetic field inhomogeneities ($T_2'$), the 180° RF pulse reverses the accumulated phase shifts and causes these nuclei to begin rephasing. At time (TE/2) after the 180° RF pulse equal to the delay between the RF excitation pulse and 180° pulses, the nuclei are in phase and produce a "spin echo". The amplitude of this spin echo is less than the initial amplitude of the free induction decay (FID) as a result of $T_2$ dephasing. This $T_2$ decay is not reversed by the 180° RF pulse. Hence the relative amplitude of two or more spin echoes may be used to directly derive $T_2$ without contribution from $T_2'$. Generally, the amplitude of the spin echo from a given volume element of the imaged object is:

$$S_1 = Pe^{-TE/T_2}(1 - e^{-TE/T_2}) \qquad (1)$$

where P is proportional to the density of the spins in that volume element.

The spin echo pulse sequence is described generally in "Magnetic Resonance Imaging, Principles and Applications" by D. N. Kean and M. A. Smith and the references therein cited.

A second imaging sequence is the "gradient recalled echo" sequence, (GRE). In the gradient recalled echo sequence, a negative gradient is used to dephase the spins which are then rephased by a positive gradient to produce a gradient echo signal. The amplitude of the gradient echo from a given volume element of the imaged object is:

$$S_2 = Pe^{-TE/T2}(1 - e^{-TE/T2})\frac{\sin(\alpha)}{1 - \cos(\alpha)e^{-TE/T1}} \quad (2)$$

where $\alpha$ is the "flip angle" of the spins from the z-axis as produced by the 180° RF pulse.

In addition to the use of MRI to collect information concerning the static physical properties of tissue, there are a number of well known MRI techniques for measuring the motion, or flow of fluids, such as blood, within a region of interest.

One such method is the "time-of-flight" method in which a bolus of spins is excited as it flows past a specific upstream location and the state of the resulting resonance signal is examined at a downstream location to determine the velocity of the bolus. This method has been used for many years to measure flow in pipes, and in more recent years it has been used to measure blood flow in human limbs. Examples of this method are disclosed in U.S. Pat. Nos. 3,559,044; 3,191,119; 3,419,793; and 4,777,957. The use of the above described GRE sequences to make time-of-flight measurements is well known.

A subclass of time-of-flight methods is comprised of "inflow/outflow methods" in which the spins in a single, localized volume or slice are excited and the change in the resulting resonance signal is examined a short time later to measure the effects of excited spins that have flowed out of the volume or slice and the effects of differently excited spins that have flowed in to the volume or slice. Examples of this method are described in U.S. Pat. Nos. 4,574,239; 4,532,473; and 4,516,582, as well as in "Three-Dimensional Time-of-Flight Magnetic Resonance Angiography Using Spin Saturation" by C. L. Dumoulin et al. published in *Magnetic Resonance In Medicine* 11:35-46 (1989).

A third measurement technique is the "phase contrast method" which relies upon the fact that a resonance signal produced by spins flowing along a magnetic field gradient exhibits a phase shift which is proportional to the velocity of the spins. Two signals are acquired, one to establish a reference and one to determine the phase shift proportional to velocity along the particular gradient. Where the direction of flow is known, or the flow component in only one direction is desired, two MRI measurement cycles are sufficient. Otherwise the sequence is repeated for each gradient for a total of six acquisitions to determine the flow along each of the three orthogonal gradient axes. This method is referred to as the six-point method and is described in commonly assigned U.S. Pat. No. 4,918,386, issued Apr. 17, 1990 and incorporated herein by reference.

An improvement in this phase contrast method, which recognizes that the reference signal may be shared for all three of the flow measurements along gradient axes, is described in commonly assigned application Ser. No. 07/564,945, now U.S. Pat. No. 5,093,620, filed Aug. 9, 1990 and entitled "ENCODING FOR MRI PHASE CONTRAST MEASUREMENT" and incorporated herein by reference. This method is termed the "balanced four point method" and provides shorter acquisition time and improved signal to noise ratio.

B. Segregation of tissue types

It is known to use MRI data to distinguish flowing blood from stationary tissue by means of the flow imaging techniques as described above Further, two or more conventional MRI sequences such as the spin echo sequence described above may be used to distinguish or contrast various types of stationary tissue. For Example, commonly assigned patent application Ser. No. 07/466,526 now still pending filed Jan. 17, 1990 and entitled: "SYSTEM AND METHOD FOR SEGMENTING INTERNAL STRUCTURES CONTAINED WITHIN THE INTERIOR REGION OF A SOLID OBJECT" and incorporated herein by reference, describes a method of discriminating between stationary tissue types through the use of two conventional spin echo MRI imaging sequences.

As recognized in the above referenced application, the use of a simple threshold for differentiating between stationary tissue types based on the data from a single MRI sequence will not be, in general, successful. Multiple stationary tissue types will be within any given range established by that threshold.

This problem may be overcome by using the data from each of two spin echo sequences adjusted to measure contrasting characteristics of the stationary tissue. The two sets of data are then used to generate a two-dimensional scatter plot in which the abscissa and ordinates of the points on the scatter plot are determined by the values of corresponding data in each of the two data sets.

Representative tissue types are identified to certain of the points on the scatter plot and the surface of the scatter plot is partitioned according to calculated probability distributions based on the statistics of these few points. This partitioning of the scatter plot generates a features map which may be used to classify the remaining data of the two sets of data acquired.

Separating stationary tissue types and differentiating vascular surfaces according to this technique requires three separate imaging sequences: two conventional MRI sequences to provide differentiation between stationary tissue types by use of the scatter plot and features map and one flow imaging sequence to clearly delineate vascular surfaces. The need to use three sequences with widely differing imaging parameters makes this method undesirably time consuming.

SUMMARY OF THE INVENTION

The present invention makes use two contrasting image arrays to differentiate stationary tissue from flowing blood and also to differentiate among stationary tissues.

Specifically, a data array V indicative of the flow of the spins and a data array M substantially insensitive to the flow of the spins is produced. The data arrays V and M are then combined to create a third array of data values used to segregate the tissues and blood. In one embodiment, both data arrays are derived from from the same MRI flow sensitive measurement cycles. Alternatively the data array M may be produced from a separate measurement cycle employing, for example, a spin echo sequence.

A limited number of data points are selected from the data values and each data point is assigned to its tissue type. The data points are selected to be approximately uniformly distributed over at least two types of stationary tissue and flowing blood. The values of these data point are used to segregate the remaining data values into the tissue types.

It is one object of the invention to eliminate the time consuming step of acquiring additional MRI data to separate stationary tissues from each other, beyond the data required to separate stationary tissue from flowing blood. It has been determined that stationary tissues may be adequately differentiated using the data collected during flow sensitive MRI measurements. This same data is then used to differentiate between the classes of stationary tissue and the flowing blood.

In a second embodiment, two sets of contrasting data are used to identify data to a number of physical structures, without forcing the data into arbitrary statistical models.

Specifically, a regular array of data values is acquired and stored. A limited sample of data points are selected, uniformly distributed over the physical structures and each identified to one physical structure. The remaining data values are then assigned to the physical structure of the data point having values closest to the data value.

It is thus another object of the invention to accurately segregate data values into a number of classes representing physical structures. In the case of tissue, it is recognized that similar tissue may properly take on a range of data values, and that the observed range does not necessarily represent a statistical error about a mean. Selecting the closest data point provides the best estimate of the tissue type of a particular data value absent other independent knowledge about the physical parameters of the structures.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION

MRI Hardware

Figure 1:
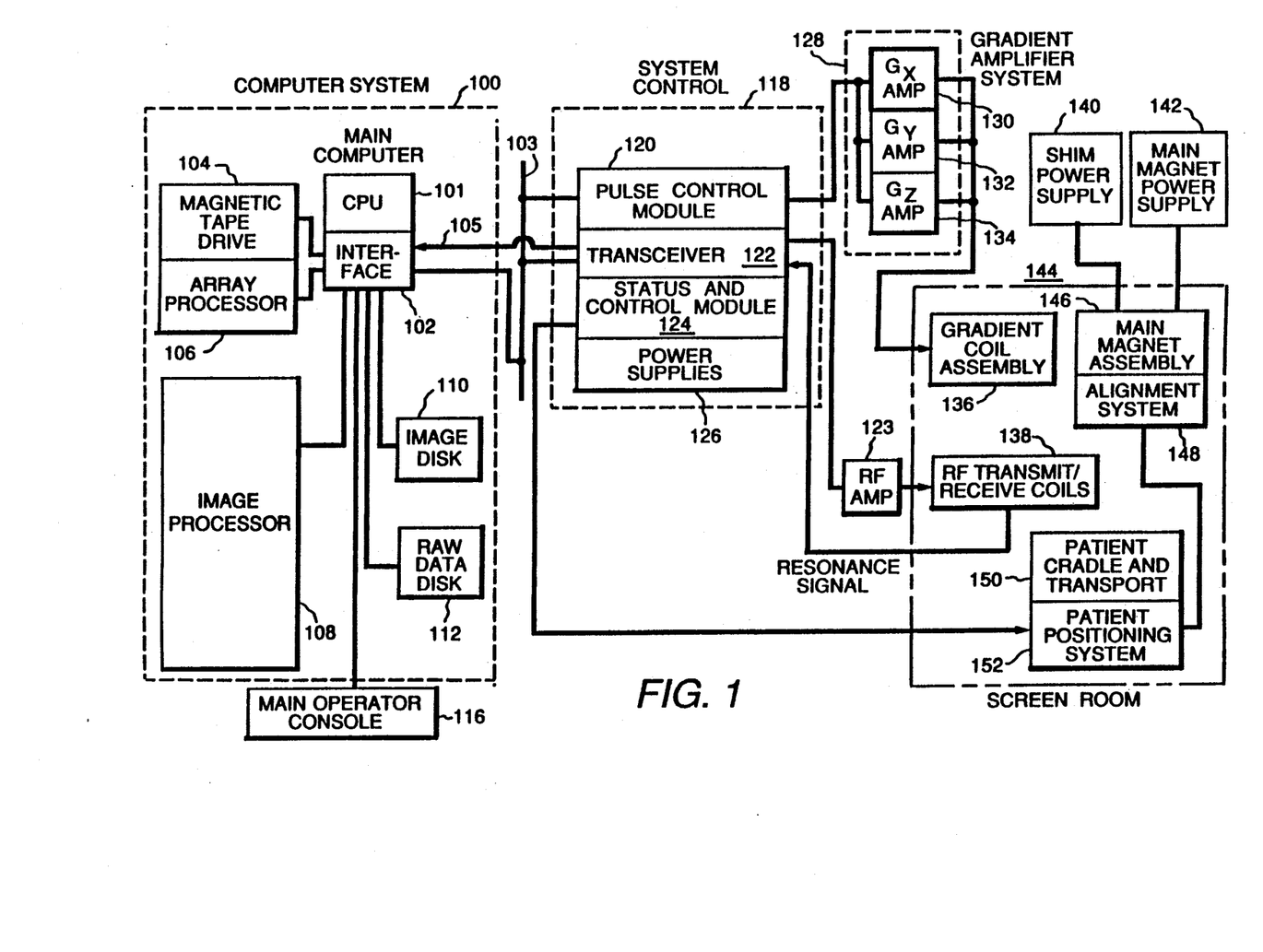
FIG. 1 is a block diagram of an MRI system which employs the present invention.

Referring to FIG. 1, there is shown in block diagram form, the major components of a preferred MRI system which incorporates the present invention and which is sold by the General Electric Company under the trademark "SIGNA". The overall operation of the system is under the control of a host computer system generally designated 100 which includes a main computer 101 (a Data General MV4000). The computer 100 includes an interface 102 through which a plurality of computer peripheral devices and other MRI system components are coupled to the main computer 101. Among the computer peripheral devices is a magnetic tape drive 104 which may be utilized under the direction of the main computer 101 for archiving patient data and image data to tape. Processed patient data may also be stored in an image disc storage device designated 110. An array processor 106 is utilized for preprocessing acquired MRI data and for image reconstruction. The function of image processor 108 is to provide interactive image display manipulation such as magnification, image comparison, gray-scale adjustment and real time data display. The image processor 108 also permits the display of the scatter plot and features map used to segregate tissue types as will be discussed further below. The computer system 100 also includes a means to store raw MRI data (i.e. before image construction) which employs a disc data storage system designated 112. An operator console 116 is also coupled to the main computer 101 by means of interface 102, and it provides the operator with the means to input data pertinent to a patient study as well as additional data necessary for proper MRI system operation, such as calibrating, initiating and terminating scans. The operator console is also used to display images stored on disc or magnetic tape and images formed by he image processor 108.

The computer system 100 exercises control over the MRI system by means of a system control 118 and a gradient amplifier system 128. Under the direction of a stored program, the computer 100 communicates with system control 118 by means of a serial communication network 103 (such as the Ethernet network) in a manner well known to those skilled in the art. The system control 118 includes several subsystems such as a pulse control module (PCM) 120, a radio frequency transceiver 122, a status control module (SCM) 124, and power supplies generally designated 126. The PCM 120 utilizes control signals generated under program control by main computer 101 to generate digital waveforms which control gradient coil excitation, as well as RF envelope waveforms utilized in the transceiver 122 for modulating the RF excitation pulses. The gradient waveforms are applied to the gradient amplifier system 128 which is comprised of $G_x$, $G_y$ and $G_z$ amplifiers 130, 132 and 134, respectively. Each amplifier 130, 132 and 134 is utilized to excite a corresponding gradient coil in an assembly designated 136 which is part of a magnet assembly 146. When energized, the gradient coils generate magnetic field gradients $G_x$, $G_y$ and $G_z$.

The gradient magnetic fields are utilized in combination with radio frequency pulses generated by transceiver 122, RF amp 123 and RF coil 138 to encode spatial information into the MRI signals emanating from the region of the patient being studied. Waveforms and control signals provided by the pulse control module 120 are utilized by the transceiver subsystem 122 for RF carrier modulation and mode control. In the transmit mode, the transmitter provides a radio frequency signal to an RF power amplifier 123 which then energizes RF coils 138 which are situated within main magnet assembly 146. The resonance signals radiated by the excited spins in the patient are sensed by the same or a different RF coil than is used for transmitting. The signals are detected, amplified, demodulated, filtered, and digitized in the receiver section of the transceiver 122. The processed signals are transmitted to the main computer 101 by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as Intel 8086) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The main power supply 142 is utilized to bring the polarizing field produced by the magnet to the proper operating strength of 1.5 Tesla and is then disconnected.

To minimize interference from external sources, the MRI system components comprised of the magnet, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room.

Figure 2:
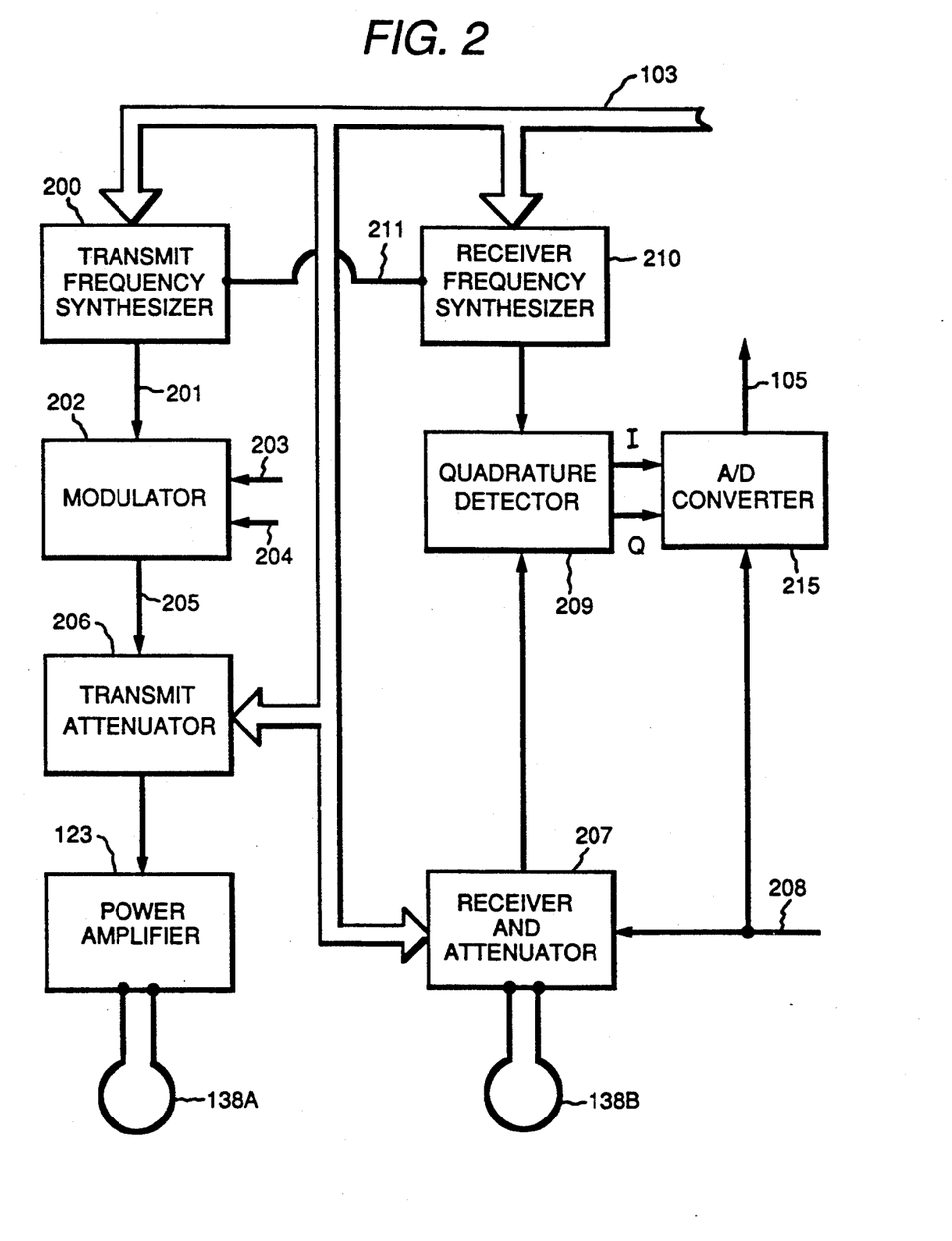
FIG. 2 is an block diagram of the transceiver which forms part of the MRI system of FIG. 1.

Referring particularly to FIGS. 1 and 2, the transceiver 122 includes components which produce the RF excitation pulse through power amplifier 123 at a coil 138A and components which receive the resulting resonance signal induced in a coil 138B. The base, or carrier, frequency of the RF excitation field is produced by a frequency synthesizer 200 which receives a set of digital signals through the communications link 103 from the main computer 101. These digital signals indicate the frequency which is to be produced at an output 201 at a resolution of one Hertz. This commanded RF carrier is applied to a modulator 202 where it is frequency and amplitude modulated in response to signals received through line 203, and the resulting RF excitation signal is turned on and off in response to a control signal which is received from the PCM 120 through line 204. The magnitude of the RF excitation pulse output through line 205 is attenuated by a transmit attenuator circuit 206 which receives a digital signal from the main computer 101 through communications link 103. The attenuated RF excitation pulses are applied to the power amplifier 123 that drives the RF transmitter coil 138A.

Referring still to FIGS. 1 and 2, the resonance signal produced by the excited spins in the subject is picked up by the receiver coil 138B and applied to the input of a receiver 207. The receiver 207 amplifies the resonance signal and this is signal is attenuated by an amount determined by a digital attenuation signal received from the main computer 101 through link 103. The receiver 207 is also turned on and off by a signal through line 208 from the PCM 120 such that the resonance signal is acquired only over the time intervals required by the particular acquisition being performed.

The received resonance signal is demodulated by a quadrature detector 209 to produce two signals I and Q that are received by a pair of analog to digital converters indicated collectively at 215. The quadrature detector 209 also receives an RF reference signal from a second frequency synthesizer 210 and this is employed by the quadrature detector 209 to sense the amplitude of that component of the resonance signal which is in phase with the RF reference (I signal) and the amplitude of that component of the resonance signal which is in quadrature therewith (Q signal).

The I and Q components of the received resonance signal are continuously sampled and digitized by the A/D converter 215 at a sample rate of 64 kHz throughout the acquisition period. A set of 256 digital numbers are simultaneously acquired for each I and Q component of the resonance signal, and these digital numbers are conveyed to the main computer 101 through the serial link 105. Each pair of numbers is thought of as a complex value equal to $I+iQ$.

Pulse Sequence

Balanced Four Point Phase-Contrast Angiography

Figure 3A:
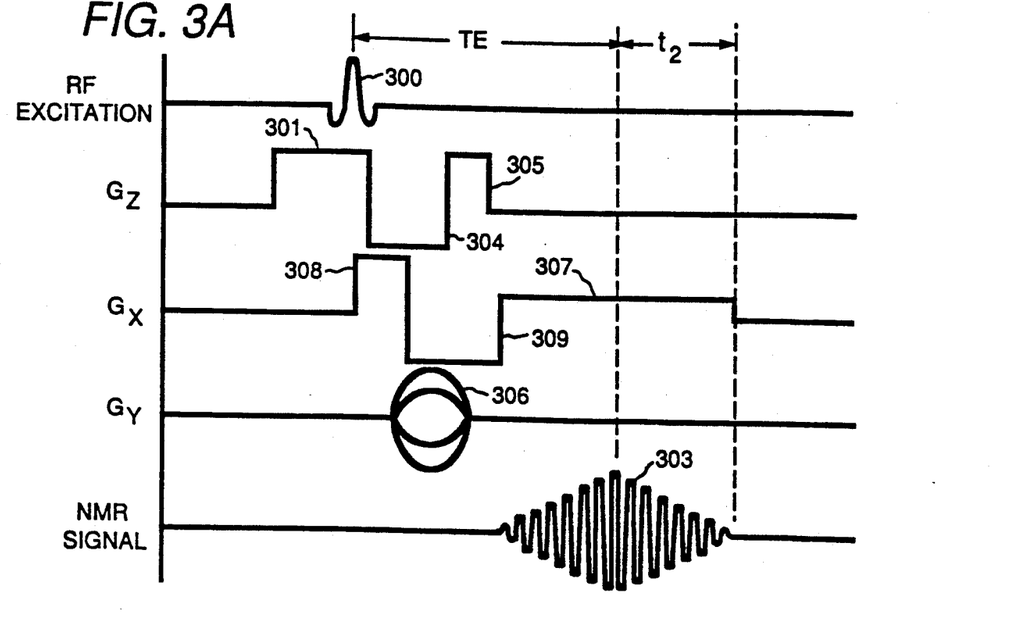
FIGS. 3A-3D are graphic representations of the MRI pulse sequences used to acquire data to measure the velocity of spins.

The MRI system of FIG. 1 performs a series of pulse sequences to collect sufficient data to reconstruct the desired velocity and stationary image. Referring particularly to FIG. 3A, the reference pulse sequence is a conventional first order moment nulled gradient echo sequence in which a selective RF excitation pulse 300 is applied to the subject in the presence of a $G_z$ slice select gradient pulse 301. The excitation pulse 300 has a flip angle of $\alpha$, with a typical value of $\alpha$ being 30°. To compensate the resonance signal 303 which is produced at a time TE after the excitation pulse 300 for the phase shifts caused by the slice select gradient pulse 301 and to desensitize the resonance signal 303 to velocity along the z axis, a negative $G_z$ gradient pulse 304 followed by a positive $G_z$ gradient pulse 305 are produced by the $G_z$ gradient coils as taught in U.S. Pat. No. 4,731,583. This technique makes use of the fact that the phase shift caused by constant velocity flowing spins is a function of the "moment" of the gradients along the axis of motion. Moment of the gradient, not to be confused with magnetic moment of the spins, is generally:

$$\int_0^{TE} G_z(t) \, t^n \, dt \qquad (3)$$

where $G_z(t)$ is the amplitude of the gradient $G_z$ over time and n is the order of the moment. Setting the zero'th and first order moments to zero reduces phase shift caused by constant velocity of the spins.

For example, the moment of $G_z$ is compensated by using pulse 304 of the same width but opposite sign as the pulse 301 and the pulse 305 is one half the width and the same height as pulse 301. While the pulses 304 and 305 compensate for velocity along the z axis, more complex gradient waveforms are also well known to those skilled in the art for compensating acceleration and even higher orders of motion.

To position encode the resonance signal 303 a phase encoding $G_y$ gradient pulse 306 is applied to the subject shortly after the application of the RF excitation pulse 300. As is well known in the art, a complete scan is comprised of a series of these pulse sequences in which the value of the $G_y$ phase encoding pulse is stepped through a series of, for example, 256 discrete phase encoding values to localize the position of the spins producing the resonance signal along the y axis.

Position along the x-axis is located by a $G_x$ gradient pulse 307 which is produced as the gradient echo resonance signal 303 is acquired and which frequency encodes the resonance signal 303. Unlike the $G_y$ phase encoding gradient pulse 306, the $G_x$ read gradient pulse 307 remains at a constant value during the entire scan. To produce the gradient echo 303 and to desensitize it to velocity along the x direction, gradient pulses 308 and 309 precede the gradient pulse 307 as taught in U.S. Pat. No. 4,731,583.

The resonance signal 303 is acquired by the system transceiver 122 and digitized into a row of 256 complex numbers which are stored in the memory of the main computer 101. For each value of the $G_y$ phase encoding gradient a resonance signal 303 is produced, acquired, digitized and stored in a separate row of complex numbers. This process is repeated for different slices selected by the $G_z$ quadrant to obtain a three-dimensional $N_x \times N_y \times N_z$ (e.g., 256 × 128 × 128) matrix of complex numbers stored in the computer 101.

The resonance signals thus produced when no flow sensitizing gradients are applied may be Fourier transformed into a conventional MRI image data. This image data is referred to herein as the reference image data set S0 and is used to calculate the reference phase image $\phi_O$ as will be described below.

Three additional measurement cycles are conducted to acquire the data needed to practice the present invention. These measurement cycles employ the pulse sequence of FIG. 3A with one important difference—the moments of the gradients selectively differ from the compensated moments of the pulse sequence of FIG. 3A so that the flow of spins becomes detectable as phase shift.

Specifically, during each subsequent MRI measurement cycle, magnetic field gradient moments are selected sensitize the resonance signal 303 to velocity along one pair of the three Cartesian coordinates. These motion encoding field gradients are produced by the same coils that produce the position encoding gradients $G_x$, $G_y$ and $G_z$ in the pulse sequence of FIG. 3A.

Figure 3B:
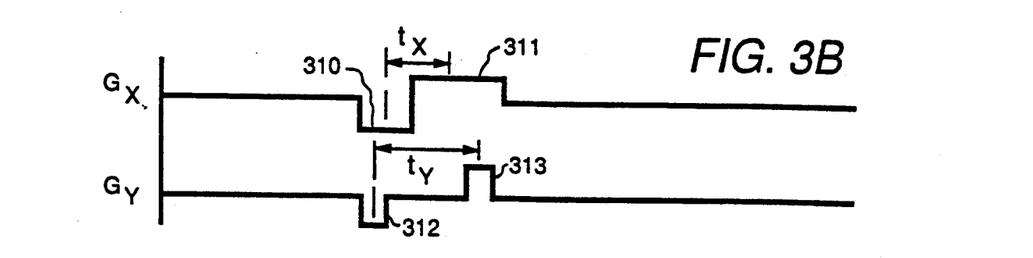

More specifically, after the reference measurement is made using the pulse sequence of FIG. 3A, a first motion encoding measurement is made with the additional gradient pulses 310–313 shown in FIG. 3B. These additional gradient pulses 310–313 are added to the motion compensated gradient pulses of FIG. 3A and they produce new gradients along the respective x and y axes. These additional gradient pulses 310/311 and 312/313 sensitize the subsequent MRI signal 303 to velocity of spins moving along the x and y axes.

The area, $A_x$, of each pulse 310 and 311 is the same and they are spaced apart by a time $t_x$. The change in the first moment from that of the pulse sequence of FIG. 3A, which was compensated to equal zero, is therefore, $\Delta Mx_1 = A_x t_x$. Similarly, pulses 312 and 313 each have an area Ay, are spaced apart by time $t_y$, and produce a first moment change $\Delta My_1 = A_y t_y$. As discussed previously, these first moment changes $\Delta Mx_1$ and $\Delta My_1$ determine the velocity sensitivity, which is typically controlled by adjusting the areas $A_x$ and $A_y$ respectively.

These motion encoding gradient pulses 310–313 are employed for a complete scan of the subject to produce a 256 × 128 × 128 array of complex numbers. This data set, when Fourier transformed, produces an image ($S_1$) which is processed as described below to produce the first incremented phase measurement $\phi_1$.

Figure 3C:
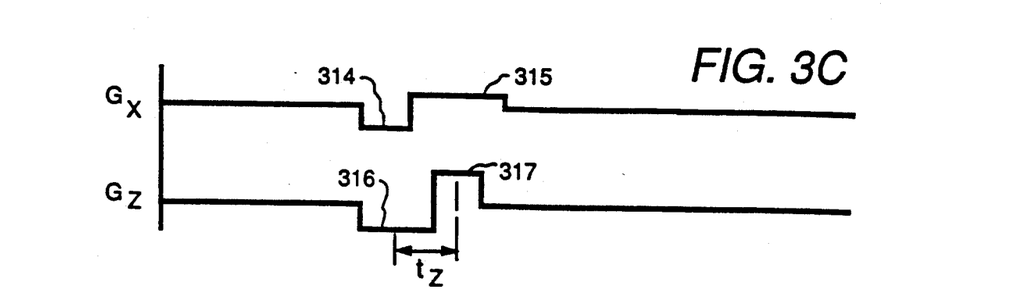

Referring particularly to FIGS. 3A and 3C, a second measurement cycle is carried out with motion encoding gradient pulses 314–317 applied to sensitize the resonance signal 303 for velocity along the x axis and z axis. Pulses 314 and 315 are substantially the same as pulses 310 and 311. Pulses 316 and 317 have equal areas $A_z$ and are spaced apart by a time $t_z$. They produce a change in first moment $\Delta Mz_1 = A_z t_z$. These motion encoding gradient pulses are added to the motion compensated gradient pulses of FIG. 3A. The resulting resonance signals are acquired to produce a 256 × 128 × 128 array of complex numbers which are transformed to produce an image data set $S_2$ that is used to calculate the second incremented phase measurements $\phi_2$.

Figure 3D:
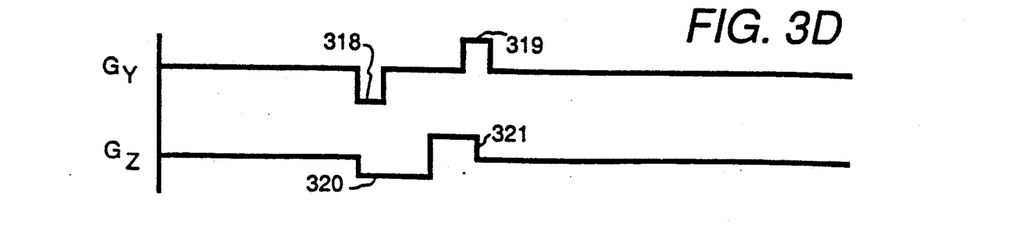

Referring particularly to FIGS. 3A and 3D, the final measurement cycle is carried out with motion encoding gradient pulses 318–321 to sensitize for velocity along the y axis and the z axis, with the pulses 318 and 319 being substantially the same as 312 and 313, and the pulses 320 and 321 being substantially the same as the pulses 316 and 317. The gradient pulses 318–321 are added to the motion compensated gradient pulses of FIG. 3A to produce changes in first moment $\Delta My_1$ and $\Delta Mz_1$. The resulting signals are acquired to produce a 256 × 128 × 128 image array $S_3$ of complex numbers that are used to calculate the third incremented phase measurements $\phi_3$.

This completes the data acquisition steps of the method and the data processing steps are commenced using the four data sets $S_0$, $S_1$, $S_2$ and $S_3$.

It should be apparent to those skilled in the art that many other pulse sequences can be used to acquire the necessary data. In addition, the acquisition of the four data sets $S_0$, $S_1$, $S_2$ and $S_3$ can be interleaved such that four measurements are made at each phase encoding value, or "view" before the phase encoding value is incremented. Also, multiple measurements may be conducted at each phase encoding value for each data set to improve signal-to-noise or to cancel system errors as described in U.S. Pat. No. 4,443,760. And finally, there are many different ways to produce the first gradient moment $M_1$ for each phase measurement. For example, the gradient pulses can be shaped differently than those shown in FIGS. 3B-3D, or they may be separated in time to increase the first moment, or they may be more compact in their temporal duration. Also, spin echo sequences using 180° RF pulses may be used, and rather than using bipolar gradient pulses, both velocity encoding pulses may have the same polarity if they are produced on opposite sides of the 180° RF excitation pulse. It is also possible to include a non-zero gradient first moment in the reference phase measurement, and indeed, the magnitude of the gradient first moment for each sequence can be cut in half if the pulses used for the reference phase measurement have a first moment $-\Delta M_{x1}/2$, $-\Delta M_{y1}/2$, and $-\Delta M_{z1}/2$ along each of the three coordinates. The important factor is that, for each axis, the gradient waveform is changed so as to alter the first moment by $\Delta M_1$ while not changing the net total area of the, gradient pulses (the zero'th moment) at the time TE.

Figure 4:
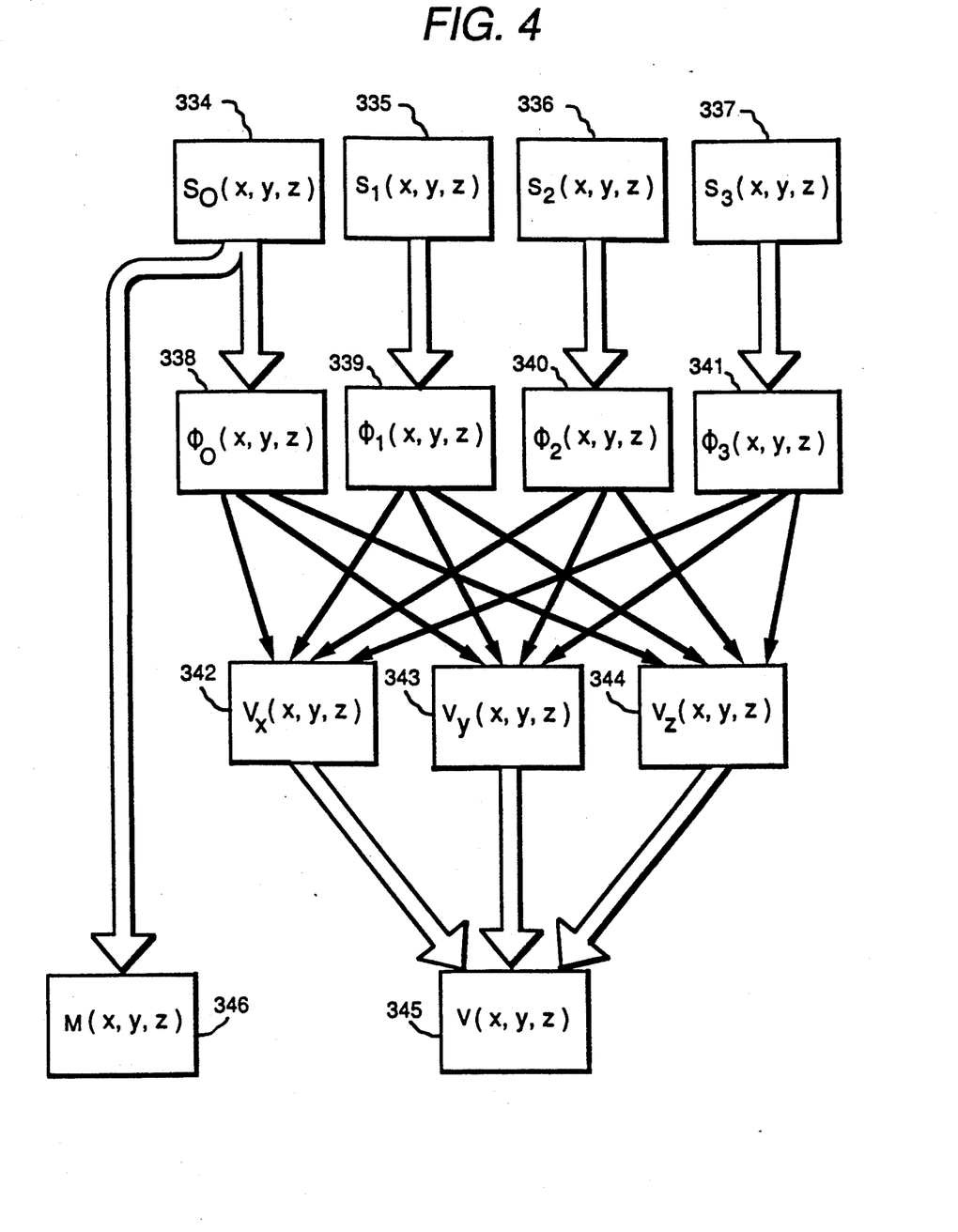
FIG. 4 is a pictorial representation of how a reference and velocity image is reconstructed from MRI data acquired using the pulse sequences of FIGS. 3.

The processing of the four data sets $S_0$, $S_1$, $S_2$ and $S_3$ to produce velocity images is illustrated in FIG. 4. All of the processing is carried out in the computer system 100 under the direction of instructions in a stored program. The four data sets for the complex images $S_0$, $S_1$, $S_2$ and $S_3$ produced by Fourier transforming the acquired resonance data are stored as arrays of complex numbers $S_0(x,y,z)$, $S_1(x,y,z)$, $S_2(x,y,z)$ and $S_3(x,y,z)$ indicated by blocks 334-337.

Each element of the arrays 334-337 is a complex number which contains information about the magnitude and phase of the resonance signals produced by the spins at a location, or pixel, in space in each of the four experiments. The phase of the resonance signal is calculated for each element of the arrays 334-337 as follows:

$$\phi = \tan^{-1}\left(\frac{Q}{I}\right) \qquad (4)$$

where

Q="imaginary" component of the complex number at a pixel, and

I="real" component of the measured value.

The arc tangent function used in equation (4) is preferably a four quadrant arc tangent such as "ATAN2" in the FORTRAN computer language As a result of these computations, four $256 \times 128 \times 128$ phase arrays 339-341 are produced to provide phase measurements $\phi_0(x,y,z)$, $\phi_1(x,y,z)$, $\phi_2(x,y,z)$ and $\phi_3(x,y,z)$.

The phase measurements $\phi_0(x,y,z)$ are the phase at each pixel in the first (e.g. flow compensated) experiments (FIG. 3A). These values are usually not precisely zero due to effects such as $B_0$ inhomogeneity, RF penetration effects, pulse sequence tuning, and whatever motion encoding is produced by the gradient pulses used in the pulse sequence of FIG. 3A. The subsequent measurements of $\phi_1$, $\phi_2$ and $\phi_3$ are also subject to these effects However, they also contain phase components which are due to the incrementally applied motion encoding gradient pulses of FIGS. 3B, 3C and 3D and the velocity of the spins along the x, y, and z axes. By combining the phase values $\phi_0$, $\phi_1$, $\phi_2$, and $\phi_3$ in the following manner, the three velocity components of the spins at each pixel of the image can be calculated.

For each point (x,y,z) in space the spin velocity components $V_x$, $V_y$ and $V_z$ are calculated using the following formulas:

$$V_x = (-\phi_0 + \phi_1 + \phi_2 - \phi_3)/2\gamma\Delta M_{x1} \qquad (5)$$

$$V_y = (-\phi_0 + \phi_1 - \phi_2 + \phi_3)/2\gamma\Delta M_{y1} \qquad (6)$$

$$V_z = (-\phi_0 - \phi_1 + \phi_2 + \phi_3)/2\gamma\Delta M_{z1} \qquad (7)$$

where $\Delta M_{x1}$, $\Delta M_{y1}$, and $\Delta M_{z1}$ are the change in first moment of motion encoding gradient between reference phase and other phase measurements in each of the x, y and z axes.

These computations result in three $256 \times 128 \times 128$ element arrays 342-344 which indicate at each point in space the respective x, y and z components of velocity. These components can be combined to produce a single velocity array, V, 345 which indicates the speed of spins v(x,y,z) at each point in space.

$$V = \sqrt{(V_x(x,y,z))^2 + (V_y(x,y,z))^2 + (V_z(x,y,z))^2} \qquad (8)$$

The values in the velocity array 345 may be mapped to a display where the velocity values control the intensity, or brightness of an image pixel.

In the preferred embodiment, the first moment changes $\Delta M x_1$, $\Delta M y_1$, and $\Delta M z_1$ in each direction are the same. This is ideal if motion direction is unknown, but this need not be so. It is also possible to use different flow encoding strengths along each axis. For example, a stronger encoding could be used in the x direction by using a larger $\Delta M x_1$ (e.g. a larger $A_x$) in FIGS. 3B and 3C when $\phi_1$ and $\phi_2$ are measured. In such case, $V_x$ is calculated in accordance with equation (5). Use of a larger $\Delta M x_1$ yields a more precise measurement of velocity, but it has a smaller dynamic range before aliasing occurs. Aliasing occurs if any of the following conditions exist:

$$|\gamma v_x \Delta M_{x1} + \gamma v_y \Delta M_{y1}| > \pi$$

$$|\gamma v_x \Delta M_{x1} + \gamma v_z \Delta M_{z1}| > \pi \qquad (9)$$

$$|\gamma v_y \Delta M_{y1} + \gamma v_z \Delta M_{z1}| > \pi$$

Subject to this constraint, the first moments can be selected to yield the most precise measurements along each axis of motion without aliasing due to high velocity.

The magnitude or modulus of the elements of the complex arrays $S_0(x,y,z)$ is also calculated to produce a conventional magnitude array 346 as follows:

$$M = \sqrt{Q^2 + I^2} \qquad (10)$$

where, as before,

Q="imaginary" component of the complex number at a pixel, and

I="real" component of the measured value.

It will be understood that any of the other complex arrays 335-337 or combinations of those arrays may also be used for the purpose of generating the magnitude array 346.

Spin Echo Plus Gradient Recalled Echo Time-Of-Flight Angiography

Alternatively, in a second embodiment, the M magnitude array 346 may be produced by a conventional spin echo sequence as has been described and the V velocity array 345 may be produced by a gradient recalled echo sequence used to measure time of flight. As will be described below, the data these two arrays may then be used to distinguish both among stationary tissue and between stationary tissue and flowing blood without additional MRI measurement cycles as have been previously required.

Segregation of Tissue Types and Blood

Figure 5:
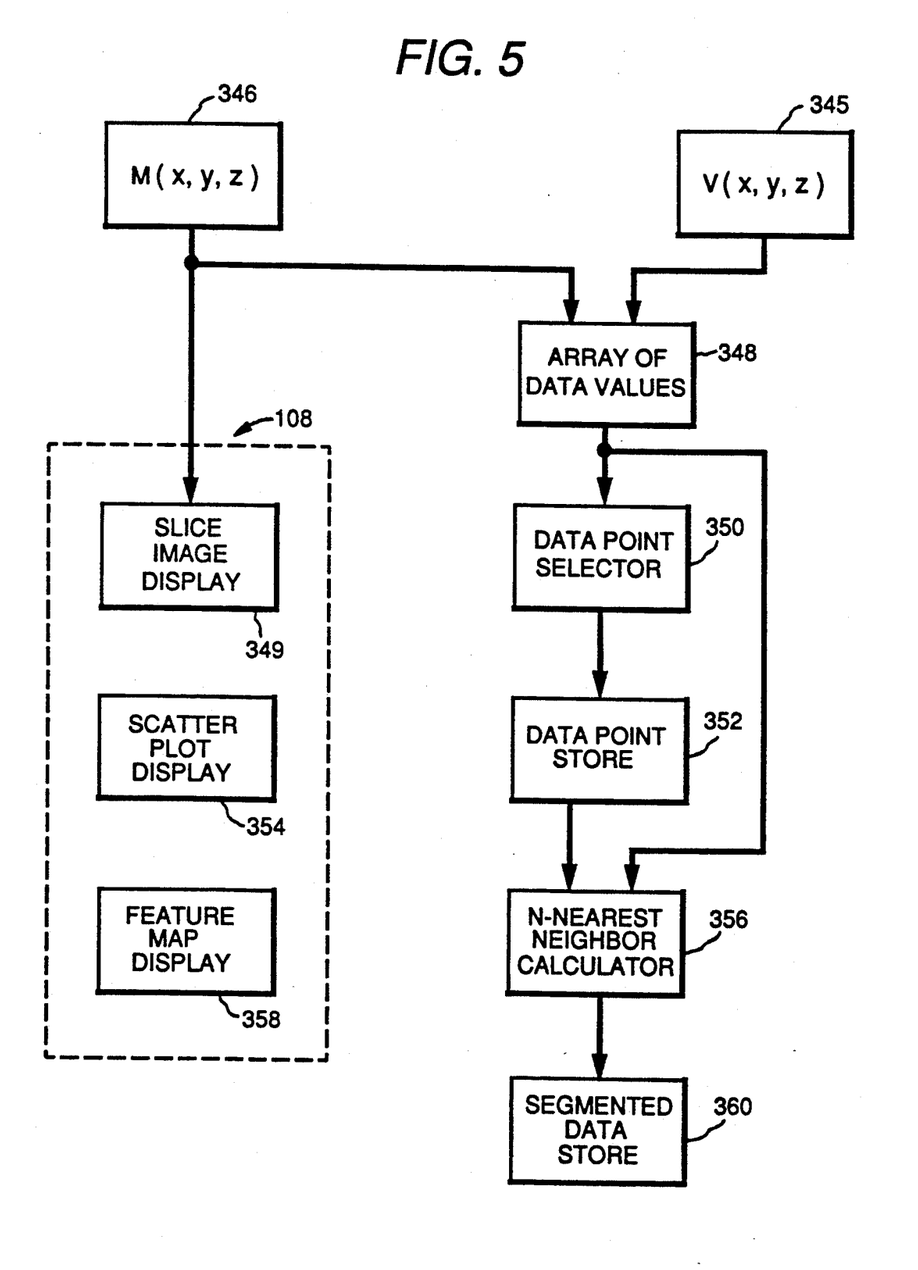
FIG. 5 is a pictorial representation of how the reference and velocity image of FIG. 4 is used to segment tissue and blood flow surfaces in accordance with the present invention.

Referring to FIGS. 1 and 5 the three dimensional velocity and magnitude data arrays 345 and 346 are combined to form an array of data values 348 where each data value for a given coordinate of the array 348 is made up of two values: one from the corresponding coordinates of the velocity array 345, and one from the corresponding coordinates of the magnitude array 346.

The data from the magnitude array M only, is also communicated to the image processor 108 so as to generate an image 349 of a two dimensional "slice" of data on the main operator console 116. The displayed slice 349 is chosen to provide the clearest differentiation between the various tissue classes, and a number of data points are selected by identifying the corresponding pixels with a data point selector 350 such as a light pen or touch sensitive screen during the display of the slice image 349. The data points are selected to provide a uniform distribution of samples over the volume of the tissues of interest. In the human head, for example, the tissue classes may comprise bone, brain, face, air, spinal and brain fluid (CSF), arteries, veins, lesions and tumors, or any desired subset of these tissue classes.

The array coordinates of the data points thus selected are stored in the data point store 352 so that the data values corresponding to each data point may be determined in the future. Further, the particular tissue class, as determined by the operator from inspection of the slice image 349, is stored with those data point coordinates.

After a significant number of such data points have been selected, normally at least twenty in each class, the corresponding data values for each data point are plotted on a scatter plot display 354 per image processor 108 and displayed on main console 116. The data points in such a scatter plot 354 tend to fall into clusters representing the different tissue classes. If each set of data points is labeled with an identification of the tissue class from which it is selected, then the clusters of data points can be identified with the corresponding tissue class. Moreover, additional sample data points can be selected to provide a more uniform distribution of such sample data points over the tissues of interest, and to further specify those areas with an ambiguous tissue classification. Thus, iterative viewing of the slice display 349, the scatter plot display 352 and selection of additional data points by the data point selector 350 permits the selection of a uniform distribution of data points over all of the tissue classes of interest within a reasonable period of time. It has been found, for example, that an experienced user can obtain twenty uniformly distributed data point for each of five different tissue classes in approximately five minutes.

Once an adequate number data points have been collected in the data point store 352, the data point coordinates and corresponding data values and the remaining data values and their coordinates are supplied to a n-nearest neighbor calculator 356.

The n-nearest neighbor calculator examines each data value of the array of data values 348 and compares the values of the flow and magnitude data for that data value to the corresponding flow and magnitude data for each of the selected data points of the data point store 352. The data point which is closest in these values is identified as the nearest neighbor. The class of tissue associated with the nearest neighbor data point is then assigned to that data value. When each data value of the data value array 348 has been assigned to the tissue classification of the nearest neighbor data point in data point store 352, this assignment may be displayed in a features map 358 where each tissue classification is given a different color and hence the boundaries of the tissue classifications is made clear.

Figure 6:
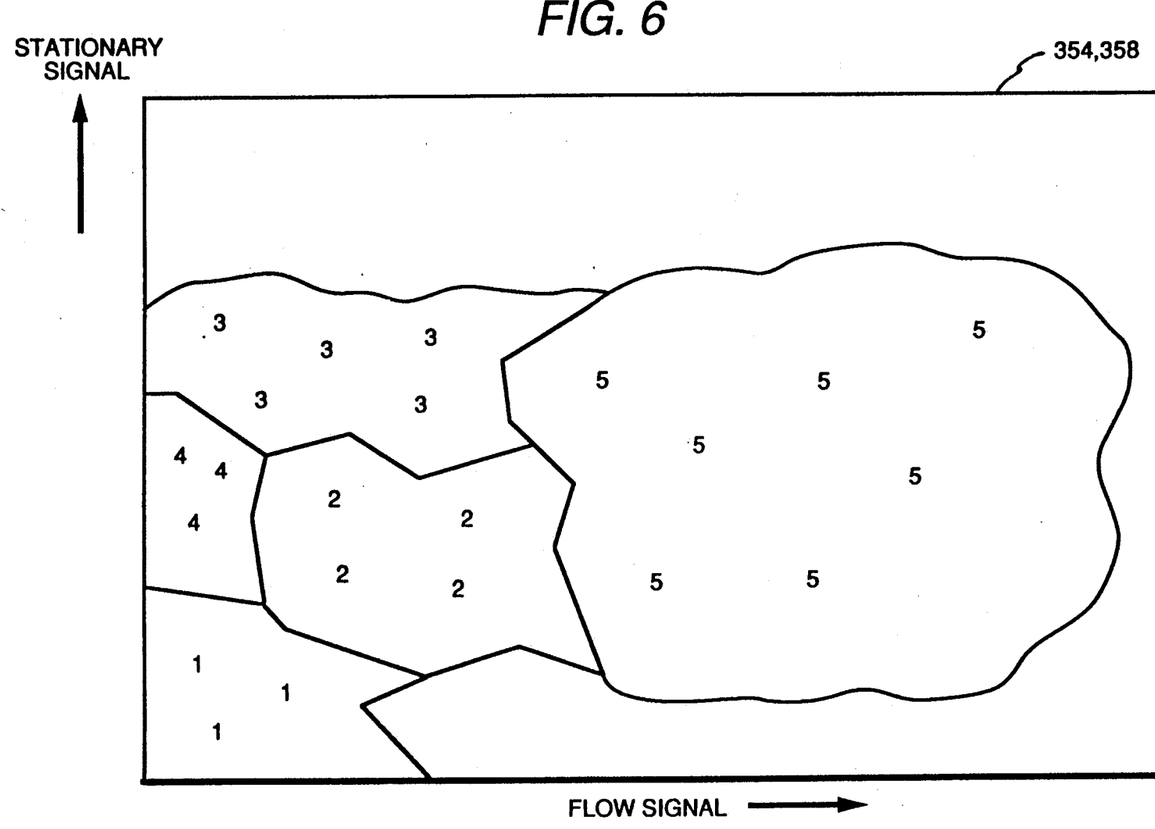
FIG. 6 is a typical scatter plot of a single slice of MRI data showing the clustering of data points from different tissues and useful in selecting sample data points for the data segmentation process of the present invention.

Referring to FIG. 6 a representative scatter plot 354 of data points each identified with a tissue or blood classification number (1–5) is superimposed on a feature map 358 showing the boundaries of the segmentation of the data values. The tissue types associated with each classification number are provided in Table 1.

TABLE 1

| classification number | tissue type |
|---|---|
| 1 | background |
| 2 | face |
| 3 | brain |
| 4 | CSF |
| 5 | flowing blood |

Key to the ability to use a flow sensitive imaging sequence to differentiate between stationary tissue is the fact that stationary tissue differentiates itself to a limited degree by flow the flow image, as is apparent from FIG. 6.

It is possible to display and examine additional slices segmented according to the selected and classified data points in data point store 352. If each tissue in the displayed cross sections is of a uniform color, the original data was correctly sampled. Misclassified pixels, however, appear as regions of incorrect coloring, indicating that the original samples did not fully segment the data. The segmentation can be improved by adding some corrected sample points to the original set and redetermining the nearest neighbors per the nearest neighbor calculator 356.

This segmentation of each data value into one of the tissue classification by the n-nearest neighbor method is computationally simple and requires a minimum amount of intervention by the operator, and produces a high quality feature map almost entirely automatically. The data values of the array of data values together with a tissue classifications according to the features map 358 are stored in the segmented data store 360.

Figure 7:
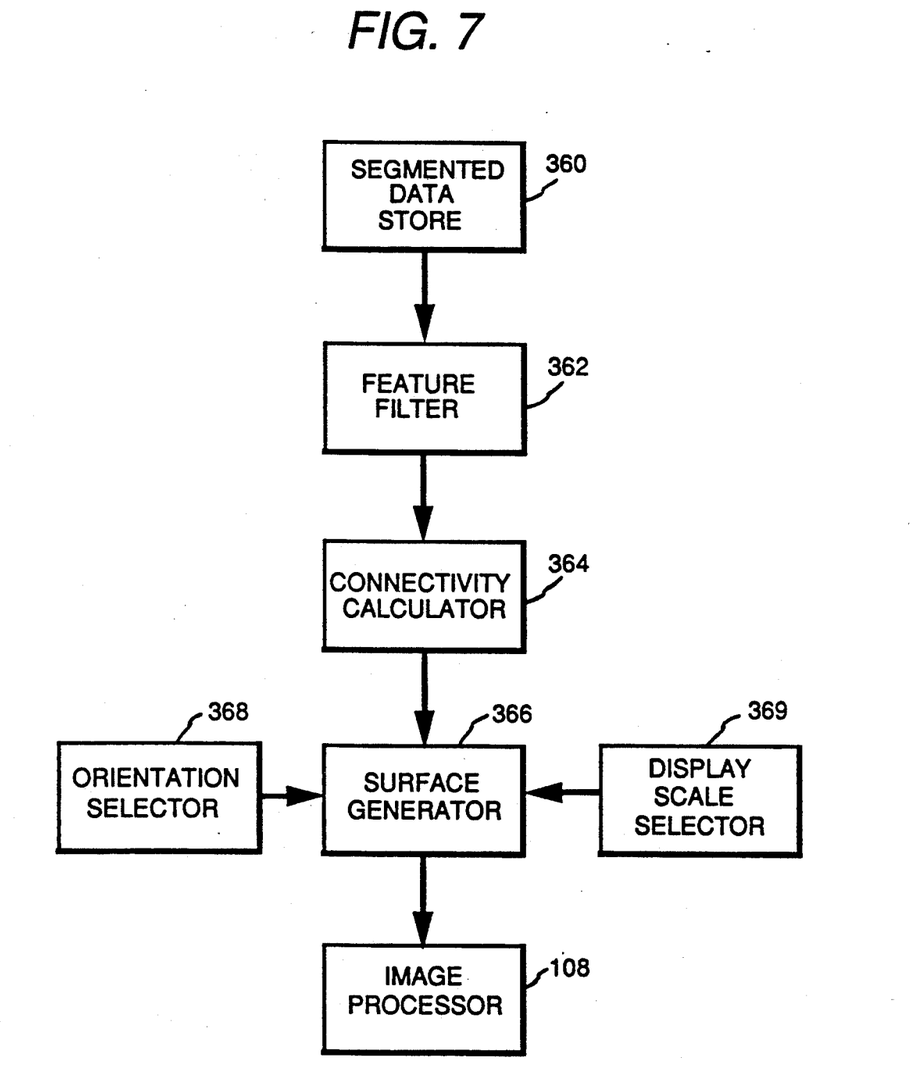
FIG. 7 is a pictorial representation of how the segmented data is used to construct a three dimensional model of the tissue and blood surfaces.

The procedure for implementing data segmentation using the system of FIG. 5 is shown in FIG. 7. The segmented data from the segmented data store 360 is subjected to filtering in a feature filter 362 to remove randomly misclassified data values and to smooth variations in the surface normal vector caused by poor definition of the direction of the surface of the segmented tissues. Such poor definition arises because the edges of the tissue regions are arbitrary step values generated by the feature map 358. Filtering the segmented data is therefore used to both establish both a smoothly varying surface normal vector to yield improved surface rendering and to remove the effect of isolated misclassified data points. A filter which is designed to approximate the three-dimensional diffusion equation is suitable for this purpose.

According to the three-dimensional diffusion equation, the concentration c of the ith tissue evolves with time according to the diffusion equation given by $$\frac{dc}{dt} = D\left[\frac{\partial^2}{\partial x} + \frac{\partial^2}{\partial y} + \frac{\partial^2}{\partial z}\right]c \tag{11}$$

Initially, the concentration of the ith tissue is binary in the sense that each data point is either within or outside of the tissue. As time passes, the data points are allowed to move in accordance with the diffusion equation (11) and the sharp transition in the composition at the tissue surface becomes diffuse. If the aspect ratio a is the ratio between the slice thickness of the data and the size of the displayed pixel, then a 3×3×3 diffusion filter, corrected for this aspect ratio, and after one iteration of the diffusion filter, is of the form:

$$c_{t+1} = \frac{c_t}{2} + \frac{a^2(c_{x+1} + c_{x-1} + c_{y+1} + c_{y-1}) + (c_{z+1} + c_{z-1})}{(4 + 8a^2)} \tag{12}$$

Diffusion filter equation (12) is applied only twice to the data so as to provide sufficient smoothing while not significantly degrading the resolution of the surfaces between tissues. Such smoothing removes isolated data values and reduces the effect of noise of the classification of tissues. As might be expected, there is a tradeoff between the improvement in segmentation and the loss of resolution generated by filtering. The filter can be applied twice without significant loss of resolution.

The filtered data from feature filter 362 can be applied to any known connectivity calculator 364 such as that described in "High Resolution 3D Images of the Brain Using a Connectivity Algorithm," by H. E. Cline et al., published in *Magnetic Resonance Imaging*, Vol. 5, No. 5, pages 345–352, 1987. Such a connectivity calculator starts with a given point in the tissue and constructs the surface by examining neighboring data values to trace and mark the surface data values. More particularly, the connectivity algorithm is recursive, starting with a seed point on the surface and collecting neighboring surface points which then become seeds for the next level of recursion. Only data points in the same tissue class need be examined, however, substantially reducing the amount of calculation while, at the same time, significantly improving surface discrimination. This recursive procedure continues until all of the connected data points for that tissue class are marked A surface point intersects surfaces of equal concentration at the midpoint of the transition where the concentration c is equal to one-half. This connectivity algorithm can be used successively to select the surfaces of all of the tissues of interest for later display.

The data point defining the surface of interest can be constructed by using the so-called "dividing cubes" method taught in H. E. Cline et al. U.S. Pat. No. 4,719,585, granted Jan. 12, 1988, and described in "Two Algorithms for the Three-Dimensional Reconstruction of Tomograms," by H. E. Cline et al., *Medical Physics*, Vol. 15, No. 3, pages 320–327, May/Jun. 1988. In this method, interpolation techniques are used between adjacent data sample to provide a data granularity matching the display pixel size. Interpolation techniques are also used to provide interpolated surface normal vectors for each interpolated surface point. A surface generator 366 provides a display list of the surface normal vectors for each of the surfaces of interest. These lists of surface normal vectors are supplied to the image processor 108. An orientation selector 368 allows the user to select the viewing orientation while a display scale selector 369 allows the user to match the data to the available display pixel size, thus maximizing the display resolution. Image processor 108 in conjunction with the display of the operator's console 116 displays the various surfaces by coloring each tissue differently and shading each point on the surfaces by a weighting proportional to the surface gradient, or angular difference between the surface normal vector and the viewing angle, at each of the point on the surfaces. Hidden surfaces can be removed with a depth buffer as taught in the aforementioned co-pending application Ser. No. 275,154, now U.S. Pat. No. 4,985,834 filed Nov. 22, 1988, and assigned to applicant's assignee. Using standard graphic processing software, the surfaces can be selectively cut, rotated and translated to allow the user to view the surfaces in the most useful rendition. Such displays are typically used to plan surgery or to check on the progress of treatment.

Generally techniques for displaying internal structures of a solid body segmented three-dimensional data arrays are taught in H. E. Cline et al. U.S. Pat. No. 4,710,876, granted Dec. 1, 1987, H. E. Cline et al. U.S. Pat. No. 4,719,585, granted Jan. 12, 1988, H. E. Cline et al. U.S. Pat. No. 4,729,098, granted Mar. 1, 1988, W. E. Lorensen et al. U.S. Pat. No. 4,751,643, granted Jun. 14, 1988, H. E. Cline et al. U.S. Pat. No. 4,791,567, granted Dec. 13, 1988, and U.S. Pat. No. 4,821,213, granted Apr. 11, 1989, all of which are assigned to applicants' assignee, and the following co-pending application of H. E. Cline et al. assigned to applicants' assignee: Ser. No. 943,357, now U.S. Pat. No. 4,879,668, filed Dec. 19, 1986, Ser. No. 247,183, now U.S. Pat. No. 4,984,157 filed Sep. 21, 1988, Ser. No. 275,154, now U.S. Pat. No. 4,985,834, filed Nov. 22, 1988, Ser. No. 282,666, now still pending filed Dec. 12, 1988 and Ser. No. 466,526, now still pending filed Jan. 17, 1990.

While only certain preferred and described herein, many modifications and changes will occur to those skilled in the art. It is, therefore, to be understood that the appended claims are intended to cover all such modifications and changes as fall within the true spirit of the invention.

What is claimed is:

1. A method for creating a three-dimensional model segmented into stationary tissue and flowing fluid types using MRI data from nuclear spins of a subject, comprising the steps of:
   a) scanning said subject to acquire a three-dimensional (3D) MRI velocity array V having array elements that substantially representing the flow of spins each at a spatial location;
   b) scanning said subject to acquire a 3D MRI magnitude array M representing stationary tissue types being substantially insensitive to flowing spins, and having array elements located in substantially the same spatial locations as the corresponding array elements in V;

c) selecting a plurality of operator-defined array element locations common to arrays V and M known to represent a desired stationary tissue or flowing fluid type;

d) plotting V and M array elements for each operator defined array element location on a two-dimensional scatter plot graph whose axes are the V and M values;

e) repeating steps "c" and "d" for a plurality of stationary tissue and flowing fluid types;

f) designating regions of the scatter plot graph to be representative of a plurality of stationary tissue and flowing fluid types on the basis of clustering of the selected points plotted in step "d";

g) classifying the remaining array element locations within V and M into types of stationary tissue or flowing fluid by comparing the V and M values of each remaining element location to the regions of the scatter plot graph designated in step "f";

h) selecting a tissue or flowing fluid type to be segmented;

i) spatially filter the classified array element locations using digital means for the purpose of smoothing edges between spatial regions for only those array element locations selected in step "h";

j) determining connectivity among spatial regions of array element locations of the type selected in step "h" to create a plurality of 3D shapes of the selected type;

k) repeating steps "h"–"j" for a plurality of stationary tissue and flowing fluid types; and l) displaying the pluralities of 3D shapes of each type on a display means to plan and guide a surgical procedure.

2. The method of claim 1 wherein the velocity array V and magnitude array M are produced by performing a set of phase shift determining MRI measurement cycles.

3. The method as recited in claim 1 wherein step (a), scanning said subject to acquire a three-dimensional (3D) MRI velocity array V, comprises:

a1) applying RF pulse and magnetic gradient pulse sequences to said subject thereby performing a reference MRI measurement cycle to produce a reference MRI data set $S_0$;

a2) applying RF pulse and magnetic pulse sequences to said subject thereby performing a first axis MRI measurement cycle in which magnetic field gradients produced by the MRI system include pulses along a first Cartesian coordinate which produce a velocity-dependent phase shift relative to a phase of the reference MRI measurement cycle to sensitize a resulting array of image data $S_1$ to the motion of the moving spins along the first Cartesian coordinate;

a3) applying RF pulse and magnetic gradient pulse sequences to said subject thereby performing a second axis MRI measurement cycle in which the magnetic field gradients produced by the MRI system include pulses along a second Cartesian coordinate which produce a velocity-dependent phase shift relative to a phase of the reference MRI measurement cycle to sensitize the resulting array of image data $S_2$ to the motion of the moving spins along said second Cartesian coordinates;

a4) applying RF pulse and magnetic gradient pulse sequence to said subject thereby performing a third axis MRI measurement cycle in which the magnetic field gradients produced by the he MRI system include pulses along a third Cartesian coordinate which produce a velocity-dependent phase shift relative to a phase of the reference MRI measurement cycle to sensitize the resulting array of image data $S_3$ to the motion of the moving spins along said third Cartesian coordinates; and a5) combining the arrays of image data $S_0$, $S_2$, $S_3$ and $S_4$ to calculated the velocity array V indicative of the flow of the spins.

4. The method as recited in claim 3 wherein step (b), scanning said subject to acquire a 3D MRI magnitude array M, comprises:

b1) applying RF pulse and magnetic gradient pulse sequences to said subject thereby performing the reference MRI measurement cycle to produce a reference MRI data set $S_0$; and b2) determining the magnitude of the data set $S_0$ to produce the magnitude array M.

5. The method as recited in claim 1 wherein the velocity array V is produced from a time-of-flight, gradient recalled echo measurement cycle and wherein the magnitude array M is produced from a single spin echo measurement cycle.

6. The method as recited in claim 1 in which step (g) comprises classifying each array element location as the tissue type or flowing fluid type corresponding to an operator-defined array element lying closest to the selected array element location on the scatter plot graph.

7. A segmentation system for creating three-dimensional (3D) models by classifying magnetic resonance imaging (MRI) data into stationary tissue and flowing fluid types comprising:

a) a magnetic resonance scanner adapted for simultaneously obtaining a 3D velocity array V and a 3D magnitude array M each having a plurality of entries, with each entry corresponding to a three-dimensional location (x,y,z) of a subject and each set representing a plurality of tissue types within the subject;

b) an image processor adapted for creating an image from the magnitude array M and the velocity array V and a scatter plot diagram;

c) a data point selector adapted for allowing an operator to select desired types of tissue or flowing fluid and a location (x,y) on the image;

d) a data point store unit adapted for storing a classification value indicating the selected tissue type, a velocity entry from the velocity array V and a magnitude entry from the magnitude array M for each selected array element location, the classification value being plotted on a graph of velocity versus magnitude to obtain the scatter plot;

e) a nearest neighbor calculator adapted for synthesizing classification values for velocity and magnitude entries having no classification value, the synthesized values being that of the nearest classification value pertaining to a selected location, and creating a feature map from information stored in the data point store unit and the synthesized classification values, and for looking up all remaining velocity and magnitude entries in the feature map and classifying them according to tissue type or type of moving fluid;

f) a segmented data store unit coupled to the nearest neighbor calculator adapted for storing the classified entires from the nearest neighbor calculator; and g) a three-dimensional processor for producing a three-dimensional model from the classification values at all array element locations.

8. The segmentation system of claim 7 wherein the three-dimensional processor comprises:

g1) a feature filter adapted for digitally smoothing a number of transitions between adjacent tissue classifications;

g2) a connectivity calculator adapted for identifying contiguous locations having the same classification values indicating the same tissue type or flowing fluid starting from selected locations;

g3) an orientation selector adapted for interacting with the operator and defining a desired model orientation;

g4) a scaling selector adapted for interacting with the operator and defining a desired model size;

g5) surface generator responsive to the orientation selector and the scale selector adapted for creating and displaying a three dimensional surface of a desired size oriented in a desired orientation of desired tissue types for moving fluids.

* * * * *